(12) United States Patent
van Meer et al.

(10) Patent No.: US 7,745,296 B2
(45) Date of Patent: Jun. 29, 2010

(54) RAISED SOURCE AND DRAIN PROCESS WITH DISPOSABLE SPACERS

(75) Inventors: Johannes van Meer, Fishkill, NY (US); Huicai Zhong, Wappingers Falls, NY (US)

(73) Assignee: Globalfoundries Inc., Grand Cayman (KY)

( * ) Notice: Subject to any disclaimer, the term of this patent is extended or adjusted under 35 U.S.C. 154(b) by 1059 days.

(21) Appl. No.: 11/147,383

(22) Filed: Jun. 8, 2005

(65) Prior Publication Data
US 2006/0281270 A1 Dec. 14, 2006

(51) Int. Cl.
*H01L 21/336* (2006.01)
(52) U.S. Cl. ............... 438/300; 438/299; 438/303
(58) Field of Classification Search .......... 438/300.303, 438/305; 257/408, 413
See application file for complete search history.

(56) References Cited

U.S. PATENT DOCUMENTS

| 6,790,733 | B1 * | 9/2004 | Natzle et al. ................ 438/300 |
| 2001/0010962 | A1 | 8/2001 | Chen et al. |
| 2004/0041216 | A1 | 3/2004 | Mori |
| 2004/0132258 | A1 | 7/2004 | Jin et al. |
| 2004/0259303 | A1 | 12/2004 | Lee et al. |
| 2004/0266124 | A1 | 12/2004 | Roy et al. |
| 2005/0048732 | A1 * | 3/2005 | Park et al. ................... 438/305 |
| 2005/0095796 | A1 * | 5/2005 | van Bentum et al. ........ 438/300 |
| 2005/0250287 | A1 * | 11/2005 | Chen et al. .................. 438/300 |

FOREIGN PATENT DOCUMENTS

WO    WO 2005/112099    11/2005

OTHER PUBLICATIONS

Translation of Official Communication, Issued May 21, 2008, Appln. No. 11 2006 001 520.6 (2 pages).

* cited by examiner

*Primary Examiner*—Fernando L Toledo
*Assistant Examiner*—Mamadou Diallo
(74) *Attorney, Agent, or Firm*—Ditthavong, Mori & Steiner, P.C.

(57) ABSTRACT

A method for forming raised source and drain regions in a semiconductor manufacturing process employs double disposable spacers. A deposited oxide is provided between the first and second disposable spacers, and serves to protect the gate electrode, first disposable spacers and a cap layer during the dry etching of the larger, second disposable spacers. Mouse ears are thereby prevented, while the use of a second disposable spacer avoids shadow-effects during halo ion-implants.

13 Claims, 7 Drawing Sheets

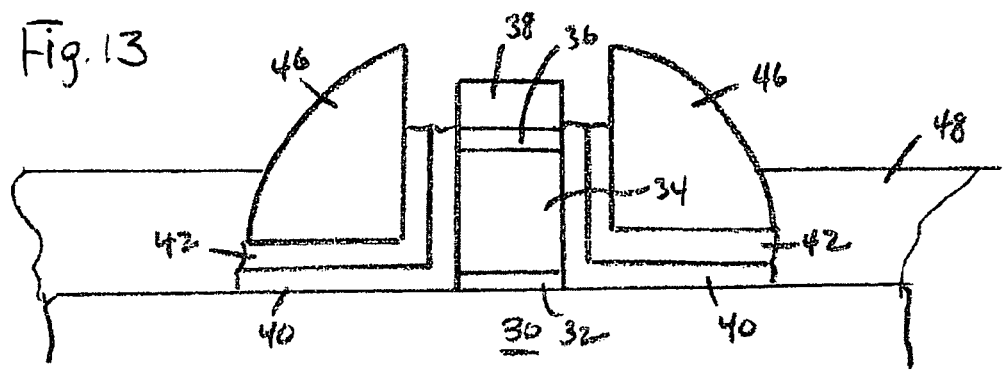
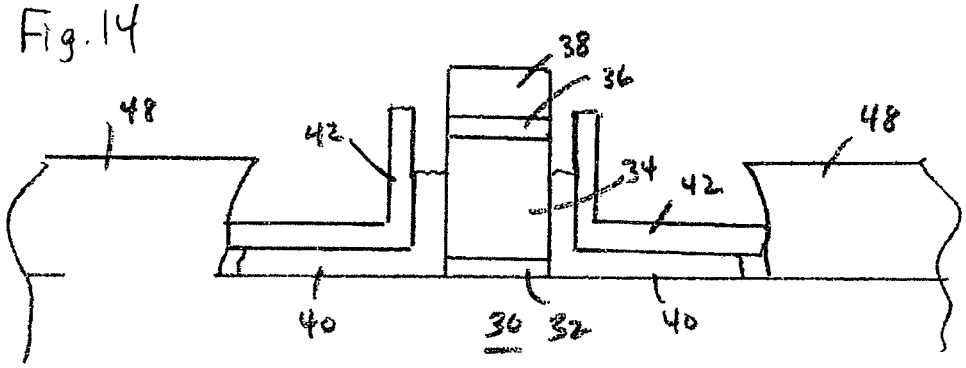
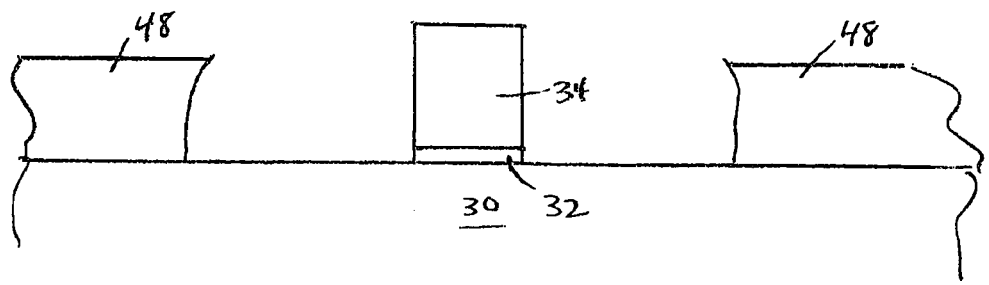

RAISED SOURCE AND DRAIN PROCESS WITH DISPOSABLE SPACERS

FIELD OF THE INVENTION

The present invention relates to the field of semiconductor manufacturing, and more particularly, the formation of semiconductor devices having elevated source and drain regions.

BACKGROUND OF THE INVENTION

Currently, deep-submicron complementary metal-oxide-semiconductor (CMOS) is the primary technology for ultra-large scale integrated (ULSI) devices. Over the last two decades, reducing the size of CMOS transistors and increasing transistor density on ICs has been a principal focus of the microelectronics industry. A ULSI circuit can include CMOS field effect transistors (FETS) which have semiconductor gates disposed between drain and source regions. The drain and source regions are typically heavily doped with a P-type dopant (boron) or an N-type dopant (phosphorous). The drain and source regions generally include shallow source and drain extension regions that are disposed partially underneath the gate to enhance transistor performance. The shallow source and drain extensions help to achieve immunity to short-channel effects that degrade transistor performance for both N-channel and P-channel transistors. Short-channel effects can cause threshold voltage roll-off and drain-induced barrier-lowering. The shallow source and drain extensions and, hence, controlling short-channel effects are particularly important as transistors become smaller.

As the size of the transistors disposed on ICs decreases, transistors with shallow ultra-shallow source drain extensions become more difficult to manufacture. For example, a small transistor may require ultra-shallow source and drain extensions with a junction depth of less than 30 nanometer (nm). Forming source and drain extensions with junction depth of less than 30 nm is very difficult using conventional fabrication techniques. Conventional ion implantation techniques have difficulty maintaining shallow source and drain extensions because point defects generated in the bulk semiconductor substrate during ion implantation can cause the dopant to more easily diffuse (transient enhanced diffusion, TED). The diffusion often extends the source and drain extensions vertically downward into the bulk semiconductor substrate. Also, conventional ion implantation and diffusion-doping techniques make transistors on the IC susceptible to short-channel effects, which result in a dopant profile tail distribution that extends deep into the substrate.

To overcome these difficulties, source and drain regions can be raised by selective silicon epitaxy to make connections to the source and drain contacts less difficult. The raised source and drain regions provide additional material for a contact silicidation process and reduced deep source/drain junction resistance and source/drain series resistance.

Raised source/drain processes employing disposable spacers have been used, but are not suitable as dimensions decrease, such as 65 nm technology nodes and below. FIGS. 16a-16c and FIGS. 17a-17d depicts some of the concerns with these approaches.

In FIG. 16a, a gate electrode 72 is provided on a substrate 70. A silicon nitride cap 74 serves to protect polysilicon gate electrode 72 from unwanted silicon growth during the selective epitaxial growth (SEG) process. The SEG process is selective towards silicon nitride, and as a result, no silicon will be grown on top of the gate electrode 72 during the SEG process.

An oxide, such as TEOS, or LTO oxide is used to form oxide liner 76. Following the formation of the oxide liner 76, a pair of sidewall spacers 78 are formed, from silicon nitride, for example. Formation of the silicon nitride spacers 78 is typically accomplished by deposition of a silicon nitride layer, followed by dry etching.

Prior to the SEG process, a wet-etch, such as a HF wet-etch, needs to be performed to remove the oxide of the oxide liner 76. Removal of the oxide is necessary since epitaxial silicon only grows on silicon surfaces. Presence of the oxide liner 76 on the substrate 70 would prevent such growth and prevent the formation of raised source/drains.

Since the oxide liner 76 is between the nitride cap layer 74 and the nitride spacers 78, a cavity can be etched during the HF wet-etch. This cavity may reach the polysilicon gate electrode 72. Since TEOS or LTO etches rapidly in HF, the probability of exposing the top left and right corners of the polysilicon gate electrode 72 is high. As a result of this exposure of the corners of the polysilicon gate electrode 72, the formation of the raised source/drain 80 creates mouse-like ears 82 to form, as depicted in FIG. 16b. The ears 82 are highly undesirable.

Referring now to FIG. 16c, the disposable nitride spacers 78 are removed to allow halo and extension implants. However, the ears 82 effectively block the implants from being properly performed. Hence, the device becomes unusable or at least severely impaired.

Another method of forming raised source/drains avoids the use of a deposited oxide liner, but instead uses a thermally grown oxide. However, as will be readily understood, the approach is not scaleable since a thinner nitride cap does not survive a nitride spacer etch, while a thinner nitride spacer results in shadow effects for the halo ion implantation process.

Referring now to FIGS. 17a-17d, a gate electrode 92 is formed on a substrate 90. A nitride cap 94 is provided on top of the polysilicon gate electrode 92. An oxide liner 96 is thermally grown, and does not cover the silicon nitride cap 94. Disposable sidewall spacers 98 are provided on the thermally grown oxide 96.

FIG. 17b depicts the structure of FIG. 17a after the formation of the raised source/drain in an ideal process. However, the top of the cap layer 94 is partially etched in the spacer etch process, so that the cap layer 94 cannot be scaled down as much as desired. The cap layer nitride loss is related to the over etch of the spacer etch process. The result of the nitride cap loss is depicted in FIG. 17c, in which "mouse ears" 102 are formed. In this figure, the nitride spacers 98 are removed by the nitride removal etch process. The mouse ears 102 prevent the halo implantation process from satisfactorily achieved. An alternative to making the cap 94 thicker is to maintain the cap 94 thin, and making the spacers 98 narrower such that the removal of the nitride spacers does not result in an overetch that exposes the top of the polysilicon gate electrode 92 prior to the SEG process. However, as depicted in FIG. 17D, the use of thin nitride spacers results in an insufficient gap between the polysilicon gate electrode 92 and the raised source drain regions 100. The halo implants, which are typically performed with a high tilt, will not be able to be performed efficaciously due to the shadow effects caused by the raised/source drains 100. In other words, the edges of the raised source/drains are too close to the sidewalls of the polysilicon gate electrode 12.

SUMMARY OF THE INVENTION

There is a need for a method of forming raised source/drains using a disposable spacer process that is scalable to small dimensions and allows for proper implantation for source/drain extensions and halo implants.

This and other needs are met by embodiments of the present invention which provide a method of forming raised source/drain areas, comprising the steps of: forming a gate electrode on a substrate, and forming double disposable spacers on each sidewall of the gate electrode. Raised source/drain regions are formed on the substrate, followed by removal of the double disposable spacers.

The earlier stated needs are also met by other embodiments of the present invention which provide a method of forming a semiconductor arrangement comprising the steps of forming first disposable spacers on a gate electrode, and forming second disposable spacers on the first disposable spacer. Raised source/drain regions are formed, and the first and second disposable spacers are removed.

The foregoing and other features, aspects and the advantages of the present invention will become more apparent from the following detailed description of the present invention when taken in conjunction with the accompanying drawings.

BRIEF DESCRIPTION OF THE DRAWINGS

FIGS. 7-15 depict sequential steps in a process for forming raised source/drain areas in accordance with other embodiments of the present invention.

DETAILED DESCRIPTION OF THE INVENTION

The present invention addresses and solves problems related to the formation of raised source/drain regions in a semiconductor device, including the problems related to source/drain extension implantation and halo implantation caused by conventional processes for creating the raised source/drains. In particular, the invention provides for scalability by employing double disposable spacers, with the first pair of spacers protecting the polysilicon gate electrode from being exposed during the SEG process. This prevents mouse ears from forming, and also allows the silicon nitride cap layer to be kept thin while allowing for wide silicon nitride sidewall spacers. The wide sidewall spacers permit the raised source/drains to be separated a sufficient and tuneable distance from the sides of the polysilicon gate electrode after etching and removal of the disposable spacers. This separation, as well as the prevention of mouse ears or other silicon overgrowth on the polysilicon gate electrode, permits unimpeded ion implantation for source/drain extension formation and halo implants.

Figure 1:
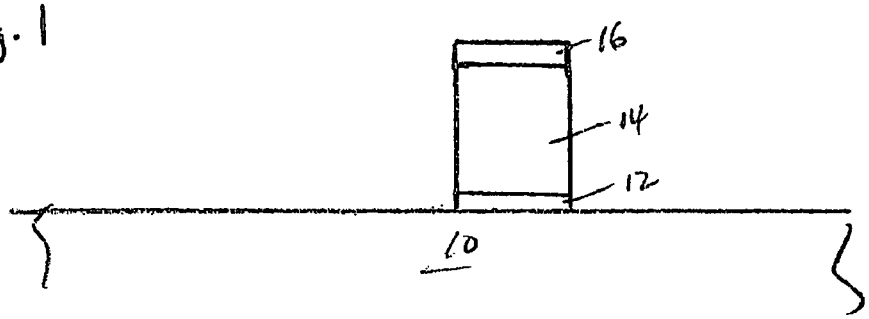
FIGS. 1-6 show a schematic depiction of a cross-section of a portion of a semiconductor wafer during various sequential process steps in accordance with certain embodiments of the present invention.

FIGS. 1-6 depict sequential steps in a semiconductor manufacturing process in accordance with certain embodiments of the present invention. The semiconductor wafer is depicted in cross-section in a schematic depiction. In FIG. 1, a gate electrode 14 is formed on a substrate 10, such as a bulk silicon substrate, a silicon-on-insulator substrate, etc. The gate electrode 14 includes a gate dielectric layer 12, made of a suitable gate dielectric material, such as an oxide, high k material, etc. A cap layer 16 is provided on the polysilicon gate electrode 14. The cap layer 16 may be made of a suitable material that will protect the surface of the gate electrode 14 during a selective epitaxial growth (SEG) process. An example of a suitable material is silicon nitride, for example. The cap layer 16 may be made relatively thin, as the present invention provides a methodology in which a thick cap layer on the polysilicon gate electrode 14 does not need to be provided. In this exemplary embodiment, the cap layer 16 may be made between 5 nm to 30 nm, for example, and in certain particular embodiments is about 20 nm. The formation of the polysilicon gate electrode 14 and the cap layer 16 may be by conventional techniques, such as CVD deposition followed by patterning and etching of the polysilicon gate electrode 14 and cap layer 16.

Figure 2:
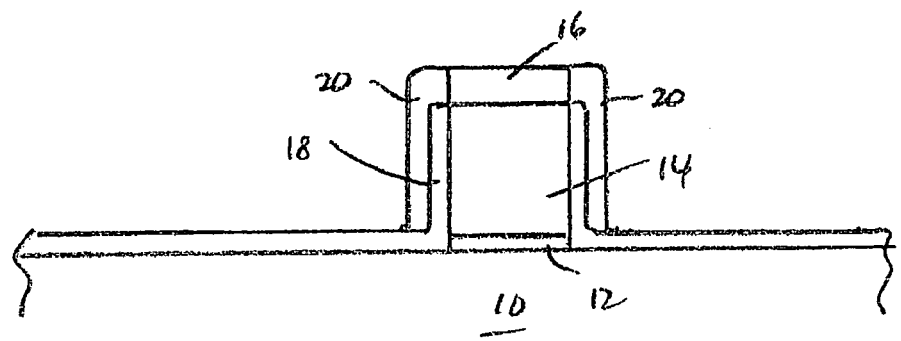

FIG. 2 shows the structure of FIG. 1 following the sequential formation of an oxide layer 18 and first disposable spacers 20. The oxide layer 18 directly contacts the sidewalls of the gate electrode 14. In the illustrated embodiment, the oxide layer 18 is a thermally grown oxide, and hence, does not form on the cap layer 16 when it is formed of nitride. The oxide layer 18 may be thermally grown in a conventional manner. The thickness may be between about 10 angstroms to about 50 angstroms and in particular embodiments, is about 35 angstroms.

Following the formation of the thermally grown oxide in the oxide layer 18, first disposable spacers 20 are formed on the oxide layer 18. In the exemplary embodiment, the first disposable spacers 20 are made of nitride, for example. The disposable spacers 20 can be considered as offset spacers, and may be made relatively thin, such as 5 to 10 nm, for example. A conventional spacer formation process may be employed to create the first disposable spacers 20, including deposition of a thin nitride layer and anisotropic etching.

Figure 3:
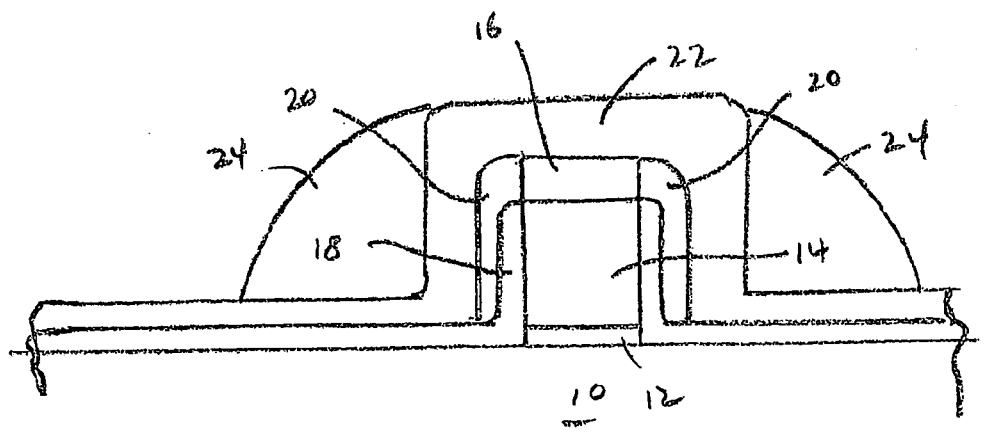

After the formation of the first disposable spacers 20 on the oxide layer 18, a relatively thick oxide liner 22 is deposited, as depicted in FIG. 3. For example, the oxide liner 22 may be between about 70 to about 80 angstroms thick, for example, although other thicknesses may be employed without departing from the present invention.

Since the offset spacers 20 are so thin, the etch process is able to stop on the thermally grown oxide of the oxide layer 18. This automatically results in the full isolation of the polysilicon gate electrode 14 for the SEG epitaxial process. Since the nitride layer 20 prior to the spacer etch is very thin, the over-etch can be minimal, which results in minimal consumption of the silicon nitride cap layer 16 underneath the nitride spacer layer present on top of the gate electrode 12 just prior to etching. The thinness of the spacers 20 allows a process window, which is necessary for very small technology nodes, such as 65 nm and below. Since little of the cap layer nitride is consumed during the first disposable spacer 20 formation, the cap layer 16 can be kept rather thin, benefiting the gate patterning of the narrow gates, such as in 65 nm technology nodes with $L_{poly}$ # 30 nm. To overcome some of these concerns, a double disposable spacer arrangement is provided.

In FIG. 3, second disposable spacers 24 are formed on the oxide liner 22. The second disposable spacers 24 are made of silicon nitride, for example, and may be formed in a conventional manner, such as by deposition of a nitride layer and etching. Since the nitride cap layer 16 is protected, the nitride cap layer 16 may be kept relatively thin while the second disposable spacers 24 may be kept wide so as to provide sufficient spacing between the raised source/drains and the sides of the polysilicon gate electrode 14.

Figure 4:
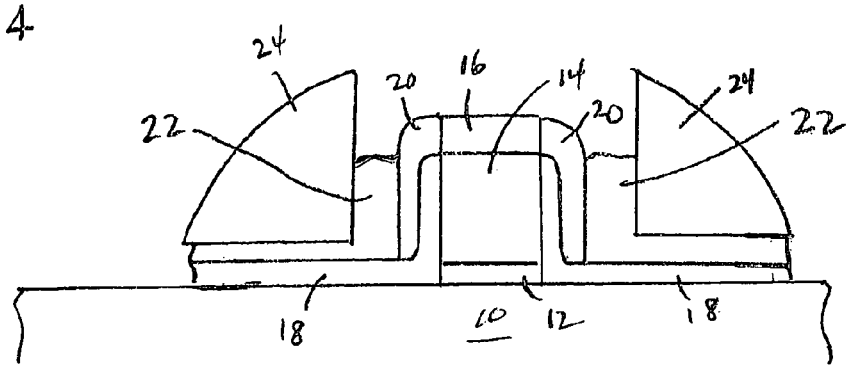

Following the formation of the second disposable spacers 24, the oxide liner 22 is etched by a conventional oxide etch, resulting in the structure of FIG. 4. This etching has the effect of removing the oxide liner 22 and the oxide layer 18 from the surface of the substrate 10.

Figure 5:
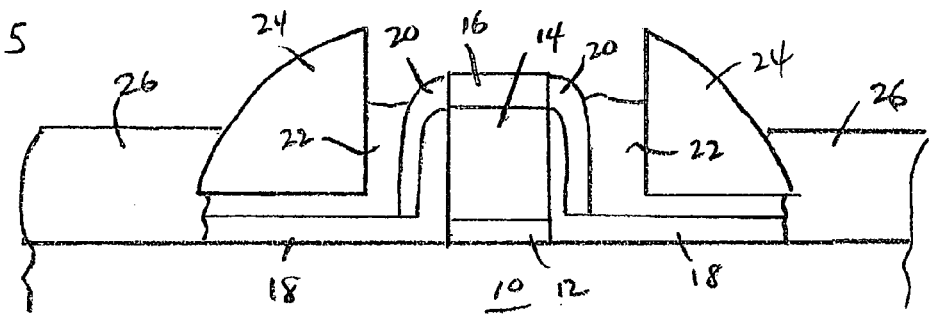

After the removal of the oxide liner 22 and the oxide layer 18 from the surface of the substrate 10, a selective epitaxial growth process is performed to create raised source/drain regions 26, as depicted in FIG. 5. The SEG process may be a conventional one, for example. During this process, the first disposable spacers 20 and the nitride cap layer 16 prevent silicon growth on the polysilicon gate electrode 14. At the same time, the relatively wide spacers 24 produce an adequate separation distance between the edges of the raised source/drain regions 26 and the polysilicon gate electrode 14.

Figure 6:
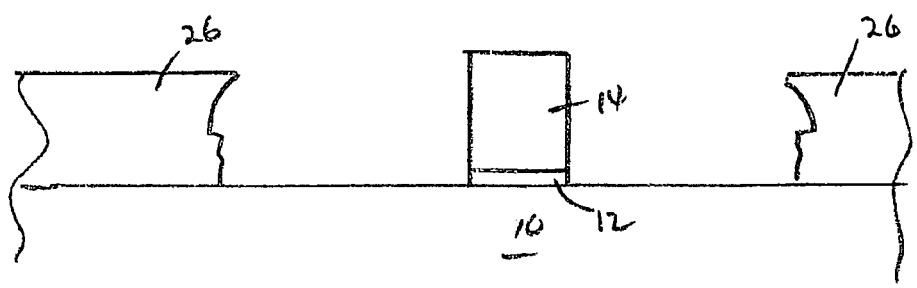

A combination or series of nitride and oxide etches are then performed to create the structure of FIG. 6. For example, a combined hot-phosphoric wet-etch to remove the double disposable spacers 20, 24 and an HF wet-etch can be used to remove the oxide layers 18, 22. The relatively wide open areas are created by the use of the double disposable spacers 20, 24, and avoids the shadow-effect during a halo ion-implant (using high-tilt) that may occur later in the formation process. Since the first disposable spacers 20 already fully isolate the polysilicon gate electrode 14, there is no danger for the creation of mouse ears, such as formed in the prior art. The size of the second disposable spacers is tunable independently of the size of the cap layer 16, thereby solving issues related to the shadowing effects for halo implants. At the same time, the first set of disposable spacers solves the problems related to mouse ears. Following the formation of the raised source/drains a conventional process may be employed to complete the formation of the semiconductor device.

FIGS. 7-15 depict sequential steps in other embodiments of the present invention for forming raised source/drains in semiconductor devices.

Figure 7:
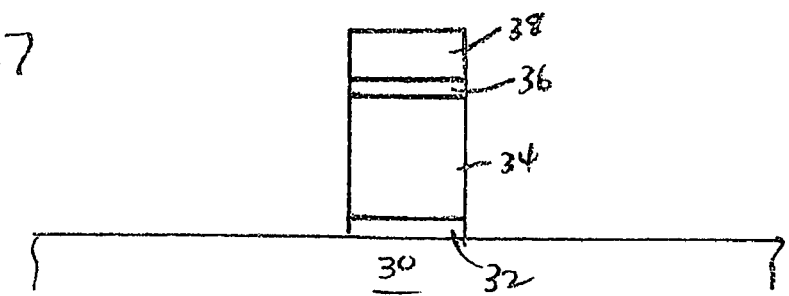

In FIG. 7, a gate electrode 34 has been formed on a substrate 30, with a gate dielectric 32 provided. The gate electrode 34 is a polysilicon gate electrode, in certain embodiments. A cap layer 36, made of silicon nitride, for example, is provided on the polysilicon gate electrode 34. The cap layer 36 may be made thin, as in the embodiment of FIGS. 1-6. Differently from the first described embodiments, a hardmask 38 is provided on top of the cap 36. The hardmask may be made of a suitable material different from the cap 36. For example, a suitable hardmask material may be silicon oxide, for example. However, other suitable materials may be employed without departing from the scope of the present invention. Conventional methodologies may be employed to create the stack depicted in FIG. 7, such as those earlier described with respect to the embodiment of FIG. 1.

Figure 8:
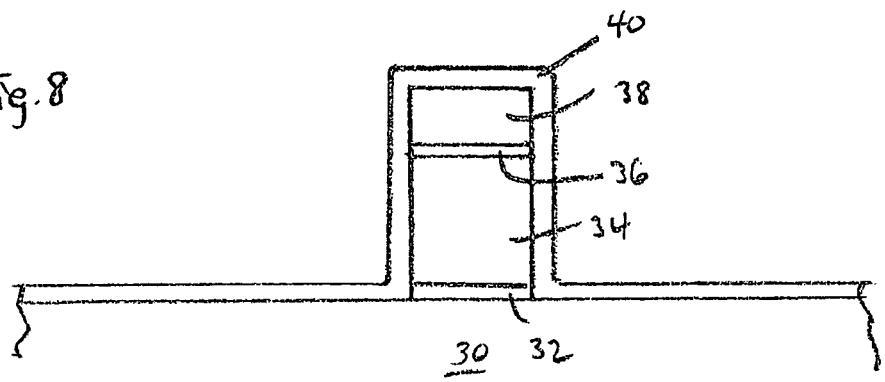

FIG. 8 depicts the structure of FIG. 7 following the formation of a silicon nitride layer 40 over the stack of FIG. 7. Silicon nitride layer 40 serves as the first disposable spacer, as will become more apparent. The thin nitride layer 40, which may be between about 5 to about 20 nm, for example, and in certain embodiments is approximately 10 nm, may be formed by a conventional methodology. The nitride layer 40 covers the sidewalls of the gate electrode 34 and also covers the cap 36 and the hardmask 38.

Figure 9:
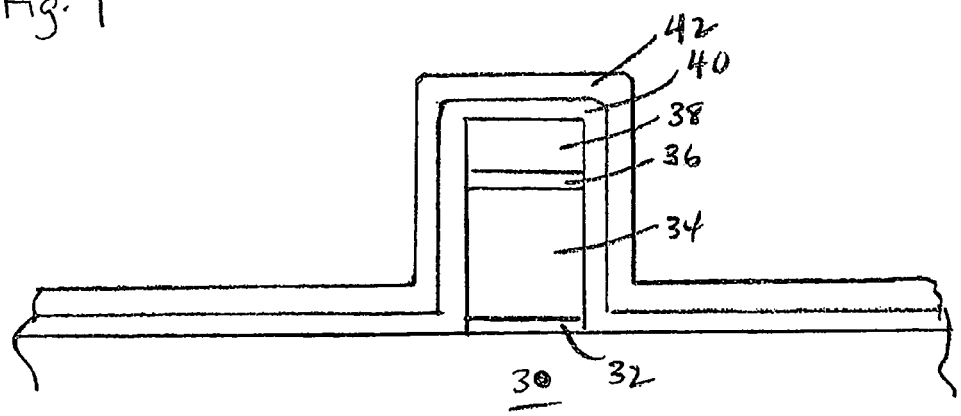

After the deposition of the thin silicon nitride layer 40, an oxide liner 42 is deposited. The oxide liner 42 is a high temperature oxide (HTO), for example. A suitable thickness is about 3 to about 10 nm, for example, and in particular, and approximately 5 nm in certain embodiments. A conventional methodology for forming the high temperature oxide may be used. The structure is depicted in FIG. 9.

Figure 10:
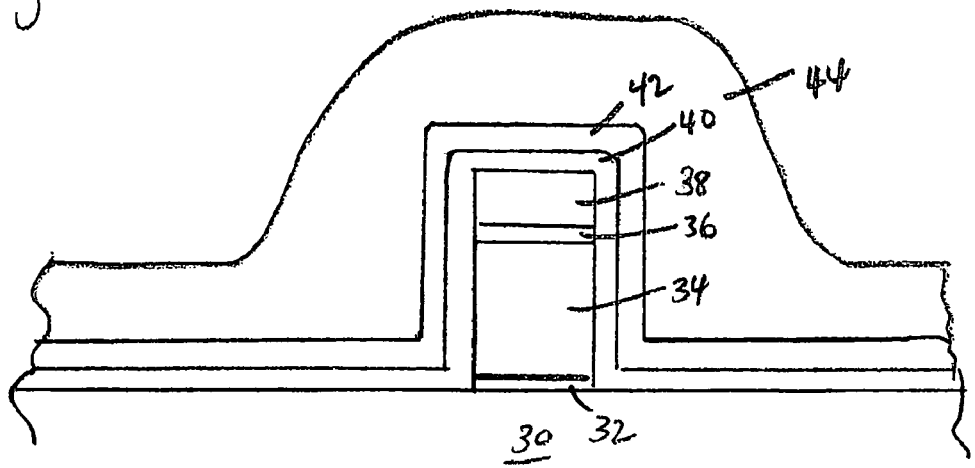

FIG. 10 shows the arrangement after deposition of a spacer layer 44, formed of silicon nitride (e.g., $Si_3N_4$). The spacer layer 44 is relatively thicker than the preceding layers 40, 42. An exemplary thickness for the spacer layer 44 is approximately 50 nm, and can range between about 20 to about 100 nm, for example.

Figure 11:
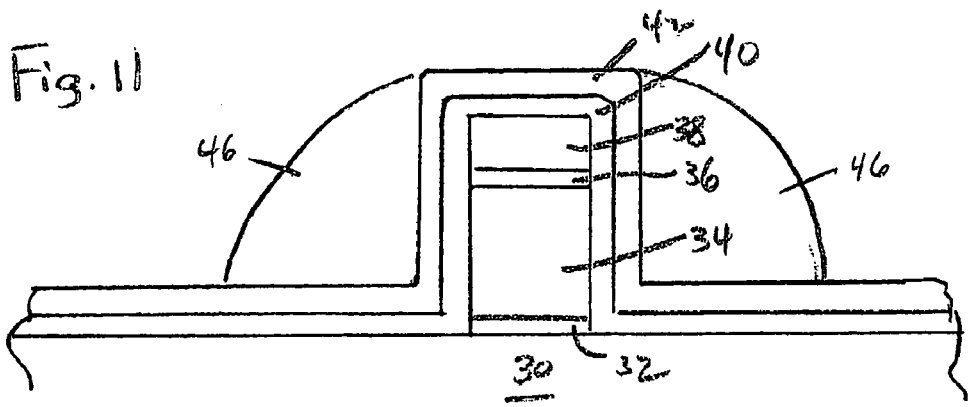

Following the deposition of the spacer layer 44, a conventional etching process is performed to create the second disposable spacers 46 from the silicon nitride of the spacer layer 44. The etch chemistry employed preferentially etches the nitride and does not substantially etch the oxide. Hence, the oxide liner 42 is preserved in this step. The second disposable spacers 46 are tunable to provide a desired width, and therefore a desired separation is achievable between the raised source/drains that will be formed and the sides of the polysilicon gate electrode 34. The structure is depicted in FIG. 11.

Figure 12:
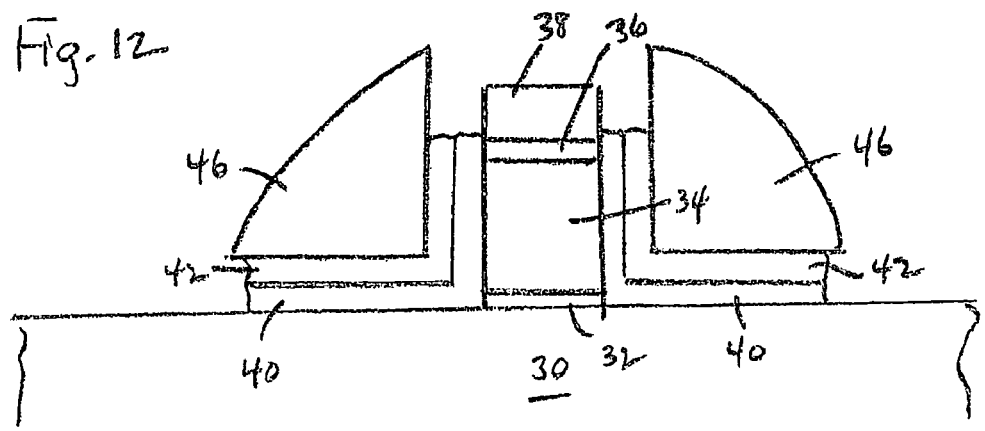
Figure 16A:
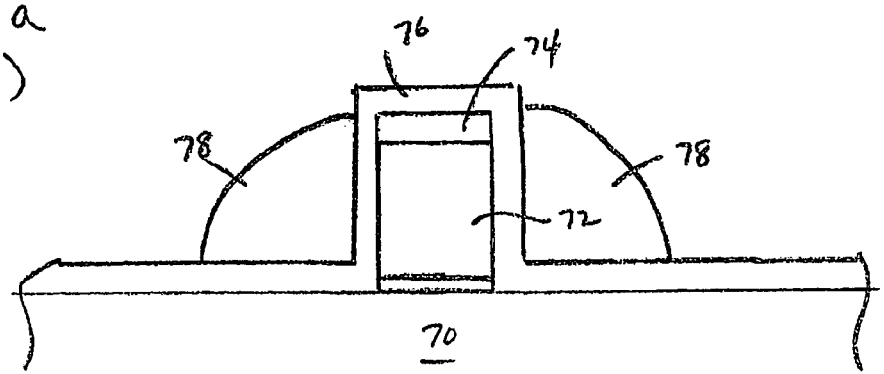
FIGS. 16a-16c depict a prior art methodology employing disposable spacers to form raised source/drain areas.
Figure 16B:
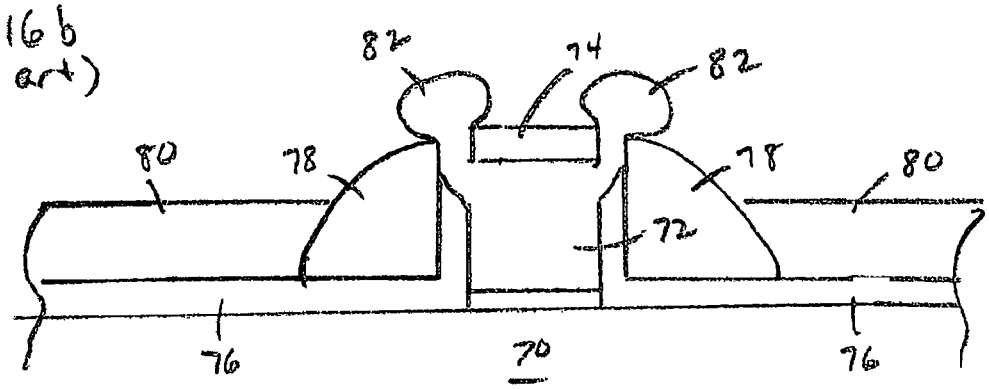
Figure 16C:
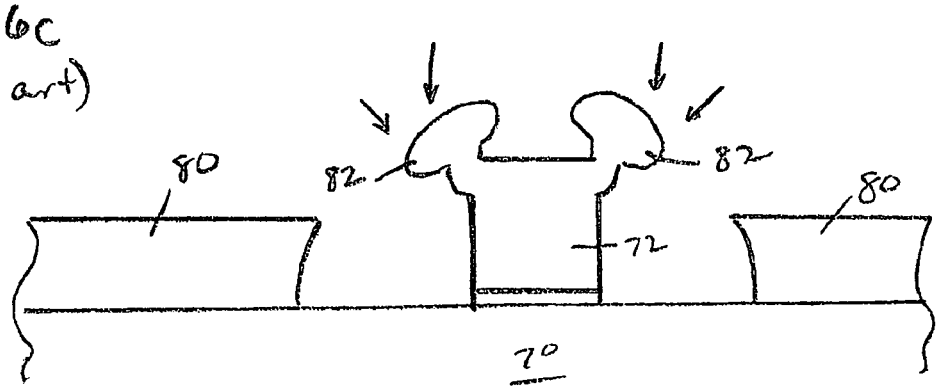
Figure 17A:
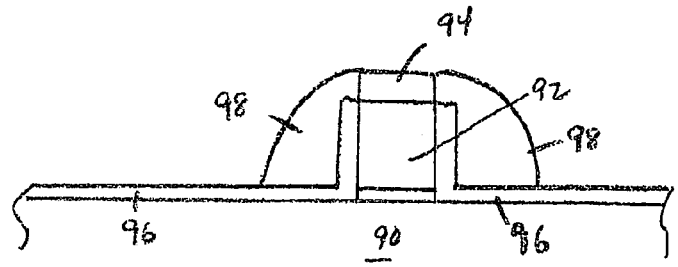
FIGS. 17a-17d show an alternative prior art methodology for forming raised source/drain areas using disposable spacers.
Figure 17B:
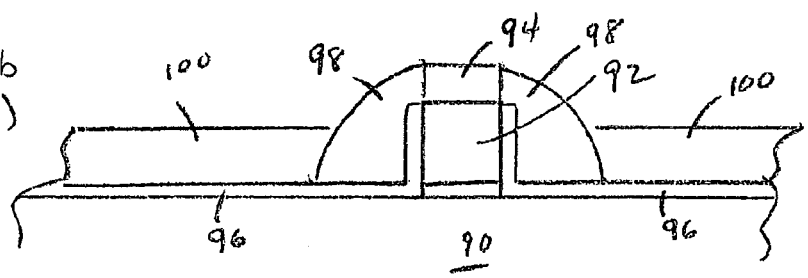
Figure 17C:
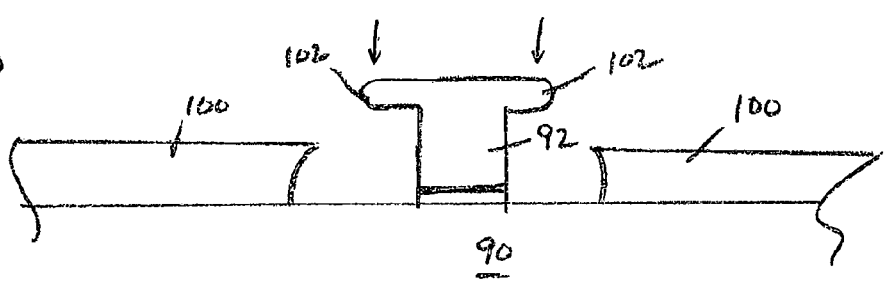
Figure 17D:
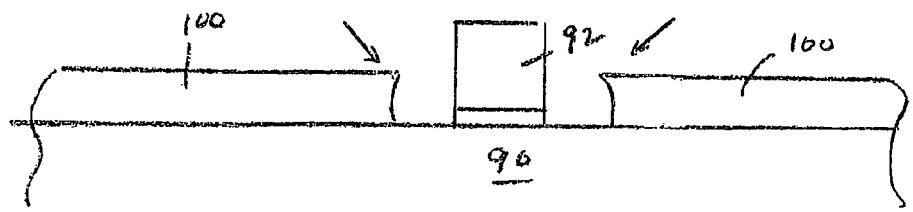

In FIG. 12, a wet-etch is performed to remove the oxide in oxide liner 42. A nitride etch then follows, to remove the thin layer of nitride 40 from the surface of the substrate 30. At this point, the hardmask 38 protects the relatively thin nitride cap layer 36, and the combination of oxide and nitride on the sidewalls of the polysilicon gate electrode 34 will prevent mouse ears from forming. The substrate 30 is now exposed outside of the second disposable spacers 46.

FIG. 13 shows the structure of FIG. 12 following a selective epitaxial growth (SEG) process to create the raised source/drains 48. A conventional SEG process is performed to create the raised source/drains 48. Because of the protection on the sidewalls and the top of the polysilicon gate electrode 34, mouse ears are prevented from forming at this region.

A nitride etch is then performed, the results of which are depicted in FIG. 14. The nitride etch removes the second disposable spacers 46. This is followed (as depicted in FIG. 15) by an etching step to remove the oxide, such as that contained in the hardmask and the remnants of the oxide liner 42. Following the removal of the oxide, the nitride cap layer 36 and the remnants of the first disposable spacers 40 are removed by a nitride etch. This leaves the same structure as depicted in the earlier embodiment of FIG. 6. Further processing of the semiconductor device may then be performed, such as source/drain extension implants and halo implants without concerns regarding undesirable blocking of the implants either by mouse ears or shadow-effects created by the raised source/drains being too close to the sidewalls of the polysilicon gate electrode.

The present invention thus provides production-worthy methods of forming raised source/drains that may be utilized in technologies that are 65 nm and below, as well as those technologies greater than 65 nm. This is achieved without comprising the subsequent processing of the semiconductor device, including source/drain extension implantation and halo implantation.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming raised source and drain areas, comprising the steps:
   forming a gate electrode on a substrate;
   forming a cap on the gate electrode;
   forming double disposable spacers on each sidewall of the gate electrode after forming the cap layer;
   forming raised source/drain regions on the substrate after forming the double disposable spacers; and
   removing the double disposable spacers after forming the raised source/drain regions, wherein
   the step of forming double disposable spacers includes forming first nitride spacers on the gate electrode and forming an oxide liner on the first nitride spacers.

2. The method of claim 1, wherein the step of forming double disposable spacers includes forming second nitride spacers on the oxide liner.

3. The method of claim 2, further comprising forming a hardmask on the cap prior to forming the first nitride spacers.

4. The method of claim 3, wherein the step of forming first nitride spacers includes forming a nitride layer directly contacting the sidewalls of the gate electrodes and covering the hardmask and the cap.

5. The method of claim 2, further comprising forming an oxide layer directly contacting the sidewalls of the gate electrode, and forming the first nitride spacers on the oxide layer.

6. The method of claim 5, wherein the step of removing the double disposable spacers includes performing a series of nitride and oxide etches to remove the first and second nitride spacers, the oxide layer, the oxide liner and the cap.

7. The method of claim 4, wherein the step of removing the double disposable spacers includes performing a series of nitride and oxide etches to remove the first and second nitride spacers, the oxide liner, the hardmask and the cap.

8. A method of forming a semiconductor arrangement, comprising the steps:
   forming first disposable spacers on a gate electrode;
   forming an oxide liner on the first disposable spacers;
   forming second disposable spacers on the oxide liner;
   forming raised source/drain regions after forming the first and second disposable spacers; and
   removing the first and second disposable spacers after forming the raised source/drain regions,
   wherein the first and second disposable spacers are made of nitride and
   wherein the first disposable spacers completely cover sidewalls of the gate electrode during the forming of the raised source/drain regions.

9. The method of claim 8, further comprising forming a nitride cap on the gate electrode.

10. The method of claim 9, further comprising forming a hardmask on the nitride cap, and wherein the step of forming the first disposable spacers include forming a first nitride layer on the sidewalls of the gate electrode and over the nitride cap and the hardmask.

11. The method of claim 10, wherein the step of forming the second disposable spacers includes blanket depositing a second nitride layer over the oxide liner and etching the second nitride layer.

12. The method of claim 9, further comprising forming an oxide layer directly contacting the sidewalls of the gate electrode, and forming the first disposable spacers on the oxide layer.

13. The method of claim 12, wherein the step of forming the second disposable spacers includes blanket depositing a nitride layer over the oxide liner and etching the nitride layer.

* * * * *